(12) United States Patent
Le Tual et al.

(10) Patent No.: US 9,432,008 B2
(45) Date of Patent: Aug. 30, 2016

(54) VARIABLE DELAY ELEMENT

(71) Applicants: STMicroelectronics SA, Montrouge (FR); STMicroelectronics International N.V., Amsterdam (NL)

(72) Inventors: Stéphane Le Tual, Saint Egreve (FR); Pratap Narayan Singh, Chahania Chandauli (IN)

(73) Assignees: STMicroelectronics International N.V., Amsterdam (NL); STMicroelectronics SA, Montrouge (FR)

( * ) Notice: Subject to any disclaimer, the term of this patent is extended or adjusted under 35 U.S.C. 154(b) by 0 days.

(21) Appl. No.: 14/337,896

(22) Filed: Jul. 22, 2014

(65) Prior Publication Data
US 2015/0028930 A1 Jan. 29, 2015

(30) Foreign Application Priority Data
Jul. 24, 2013 (FR) ...................................... 13 57284

(51) Int. Cl.
*H03K 5/13* (2014.01)
*H03K 5/134* (2014.01)
*H03K 5/00* (2006.01)

(52) U.S. Cl.
CPC ............... *H03K 5/134* (2014.07); *H03K 5/13* (2013.01); *H03K 2005/00032* (2013.01); *H03K 2005/00208* (2013.01); *H03K 2005/00215* (2013.01); *H03K 2217/0018* (2013.01)

(58) Field of Classification Search
CPC combination set(s) only.
See application file for complete search history.

(56) References Cited

U.S. PATENT DOCUMENTS

| 5,051,630 | A | | 9/1991 | Kogan et al. |
| 5,473,277 | A | | 12/1995 | Furumochi |
| 5,892,260 | A | * | 4/1999 | Okumura ............ H01L 27/0218 257/347 |
| 5,912,591 | A | * | 6/1999 | Yamada ............... H03K 3/0231 326/36 |
| 6,111,455 | A | * | 8/2000 | Eleyan ................ H03K 17/163 327/534 |
| 6,157,216 | A | | 12/2000 | Lattimore et al. |
| 6,819,158 | B2 | * | 11/2004 | Mizuno .......... H03K 19/018585 327/158 |

(Continued)

OTHER PUBLICATIONS

Cakici, et al., "Independent Gate Skewed Logic in Double-Gate SOI Technology," 2005 IEEE International SOI Conference, Date of Conference Oct. 3-6, 2005, 2 pages.

(Continued)

*Primary Examiner* — An Luu
(74) *Attorney, Agent, or Firm* — Slater Matsil, LLP

(57) ABSTRACT

A delay circuit includes first and second transistors and a biasing circuit. The first transistor has a control node coupled to an input node of the delay circuit, a first main current node coupled to a first supply voltage, and a second main current node coupled to an output node of the delay circuit. A second transistor has a control node coupled to the input node, a first main current node coupled to a second supply voltage, and a second main current node coupled to the output node. The biasing circuit is configured to generate first and second differential control voltages, to apply the first differential control voltage to a further control node of the first transistor and to apply the second differential control voltage to a further control node of the second transistor.

26 Claims, 2 Drawing Sheets

(56) References Cited

U.S. PATENT DOCUMENTS

| | | | |
|---|---|---|---|
| 7,772,917 B2* | 8/2010 | Itoh | G11C 5/146 326/86 |
| 8,112,754 B2* | 2/2012 | Shikano | G06F 9/5027 713/400 |
| 8,384,425 B2 | 2/2013 | Mazure et al. | |
| 8,432,216 B2 | 4/2013 | Mazure et al. | |
| 2006/0181323 A1 | 8/2006 | Cranford et al. | |
| 2007/0176233 A1 | 8/2007 | Ozawa et al. | |
| 2009/0070772 A1 | 3/2009 | Shikano | |
| 2009/0212838 A1 | 8/2009 | Kim et al. | |
| 2012/0182070 A1 | 7/2012 | Soussan et al. | |
| 2013/0321057 A1 | 12/2013 | Soussan et al. | |

OTHER PUBLICATIONS

Chen, et al., "A High Speed SOI Technology with 12ps/18ps Gate Delay Operating at 5V/1.5V," Date of Conference Dec. 13-16, 1992, 4 pages.

Majumdar, et al., "Undoped-Body Extremely Thin SOI MOSFETs With Back Gates," IEEE Transactions on Electron Devices, vol. 56, No. 10, Oct. 2009, 7 pages.

Zhang, et al., "Double-Gate Fully-Depleted SOI Transistors for Low-Power High-Performance Nano-Scale Circuit Design," Meeting Date Aug. 6 and 7, 2001, 6 pages.

* cited by examiner

VARIABLE DELAY ELEMENT

This application claims the priority benefit of French Patent application number 13/57284, filed on Jul. 24, 2013, the contents of which is hereby incorporated by reference in its entirety to the maximum extent allowable by law.

TECHNICAL FIELD

The present application relates to the field of variable delay circuits.

BACKGROUND

Delay circuits or cells are often used to apply a time delay to an input signal, in particular to cause transitions of a digital signal to be delayed. In CMOS (complementary MOS) technology, an inverter is often used as a delay circuit.

Delay circuits or cells having a variable delay are often used in applications where a time constant is to be tuned, such as in DLLs (delay locked loops), ring oscillators, TDCs (time to digital converters), and pulse width modulators. Often, the delay is variable between several fixed time durations, and the complexity of the delay circuit increases as the number of selectable time durations increases. Furthermore, to provide such a variable delay, active components are generally added in the signal path, leading to the addition of jitter.

SUMMARY OF THE INVENTION

Embodiments of the present disclosure at least partially address one or more needs in the prior art. For example, embodiments address a technical difficulty in providing a variable delay circuit of relatively low complexity, high speed and low jitter, which allows a relatively fine time adjustment of the delay time over a relatively broad range, and/or that is adapted to relatively low voltage applications.

According to one aspect, a delay circuit comprises a first transistor of a first conductivity type and a second transistor of a second conductivity type. The first transistor includes a control node coupled to an input node of the delay circuit, a first main current node coupled to a first supply voltage, and a second main current node coupled to an output node of the delay circuit. The second transistor includes a control node coupled to the input node, a first main current node coupled to a second supply voltage, and a second main current node coupled to the output node. A biasing circuit is configured to generate first and second differential control voltages, to apply the first differential control voltage to a further control node of the first transistor, and to apply the second differential control voltage to a further control node of the second transistor.

According to one embodiment, the biasing circuit is configured to adjust a delay of the delay circuit by modifying voltage levels of the first and second differential control voltages.

According to one embodiment, the biasing circuit comprises a differential amplifier.

According to one embodiment, the delay circuit further comprises a control circuit configured to provide a control signal to the biasing circuit to control the levels of the first and second differential control voltages based on a delay to be applied by the delay circuit.

According to one embodiment, the first and second transistors each have an SOI (semiconductor on insulator) structure and the further control nodes are coupled to back gates of the first and second transistors.

According to one embodiment, the first and second transistors comprise a semiconductor layer isolated from the back gate by a layer of insulator.

According to one embodiment, at least one of the first and second transistors comprises a p-type well forming the back gate, and the p-type well is isolated from a p-type substrate by a deep n-type well.

According to one embodiment, the first main current node of the first transistor is coupled to the first supply voltage via a third transistor of the first conductivity type having a control node; and the first main current node of the second transistor is coupled to the second supply voltage via a fourth transistor of the second conductivity type having a control node.

According to one embodiment, the biasing circuit is further configured to apply the first differential control voltage to a further control node of the third transistor and to apply the second differential control voltage to a further control node of the fourth transistor.

According to one embodiment, the control nodes of the third and fourth transistors are each coupled to the input node.

According to one embodiment, the control node of the third transistor is adapted to receive a third control voltage and the control node of the fourth transistor is adapted to receive a fourth control voltage.

According to a further aspect, an electronic device comprises the above delay circuit and circuitry coupled to the output node of the delay circuit.

According to one embodiment, the circuitry provides a feedback signal to the biasing circuit.

According to a further aspect, a method can be used to control the time delay of a delay circuit. First and second differential control voltages are generated. The first differential control voltage is applied to a further control node of a first transistor of a first conductivity type. The first transistor includes control node coupled to an input node of the delay circuit, a first main current node coupled to a first supply voltage, and a second main current node coupled to an output node of the delay circuit. The second differential control voltage is applied to a further control node of a second transistor of a second conductivity type. The second transistor includes a control node coupled to the input node, a first main current node coupled to a second supply voltage, and a second main current node coupled to the output node.

According to one embodiment, the method further comprises modifying voltage levels of the first and second differential control voltages based on a delay adjustment to be applied by the delay circuit.

BRIEF DESCRIPTION OF THE DRAWINGS

The foregoing and other features and advantages will become apparent from the following detailed description of embodiments, given by way of illustration and not limitation with reference to the accompanying drawings, in which.

DETAILED DESCRIPTION OF ILLUSTRATIVE EMBODIMENTS

Figure 1:
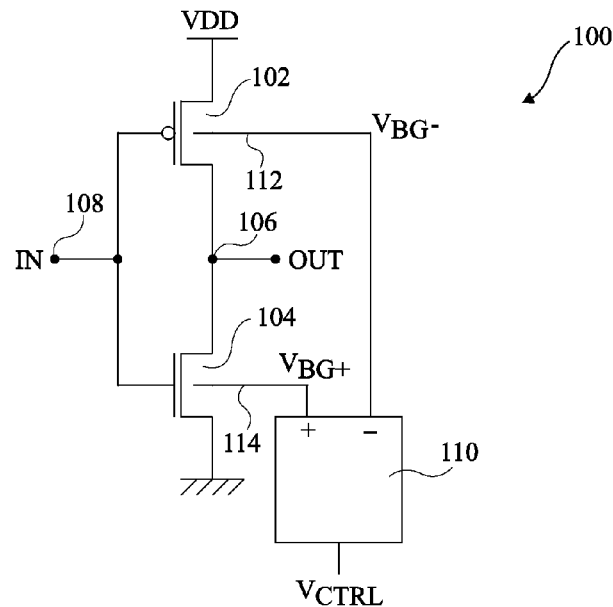
FIG. 1 schematically illustrates a delay circuit according to an embodiment of the present disclosure.

FIG. 1 schematically illustrates a delay circuit 100 according to an example embodiment.

Delay circuit 100 comprises transistors 102 and 104 of different conductivity types. The transistors 102 and 104 are connected to form an inverter. Transistor 102 is, for example, a p-channel MOS (PMOS) transistor, and has one of its main current nodes, for example its source, coupled to a supply voltage VDD, and its other main current node, for example its drain, coupled to an output node 106 of the delay circuit 100. Transistor 104 is, for example, an n-channel MOS (NMOS) transistor, and has one of its main current nodes, for example its source, coupled to the ground voltage GND, and its other main current node, for example its drain, coupled to the output node 106. Transistors 102, 104 each have their control node coupled to an input node 108 for receiving an input signal IN to be delayed.

The delay circuit 100 further comprises a biasing circuit 110, which is configured to generate differential control voltages $V_{BG-}$ and $V_{BG+}$ for adjusting the time delay applied to the input signal IN by the respective transistors 102, 104. In particular, each of the transistors 102, 104 comprises a further control node 112, 114 respectively. For example, the transistors 102, 104 have SOI (silicon on insulator) structures, and the further control nodes 112, 114 correspond to back gates of the transistors. The control voltage $V_{BG-}$ is provided to the further control node 112 of transistor 102, and the control voltage $V_{BG+}$ is provided to the further control node 114 of transistor 104. The biasing circuit 110, for example, generates the control voltages $V_{BG+}$ and $V_{BG-}$ based on an input control signal $V_{CTRL}$, which is for example a single-ended or differential control signal. The control signal $V_{CTRL}$ is for example a feedback signal, although it could additionally or alternatively be based on one or more pre-determined values stored in a memory (not shown in FIG. 1).

In some embodiments, the biasing circuit 110 is implemented by a differential amplifier that receives a single-ended or differential input control signal, and provides the differential output signals VBG−, and VBG+. The differential amplifier is, for example, an operational amplifier, or other type of amplifying circuit, for example comprising a differential pair.

In operation, a variation of the differential control voltages $V_{BG+}$, $V_{BG-}$ causes the conduction characteristics of the transistors 102, 104 to be modified, as will now be described with reference to FIG. 2.

Figure 2:
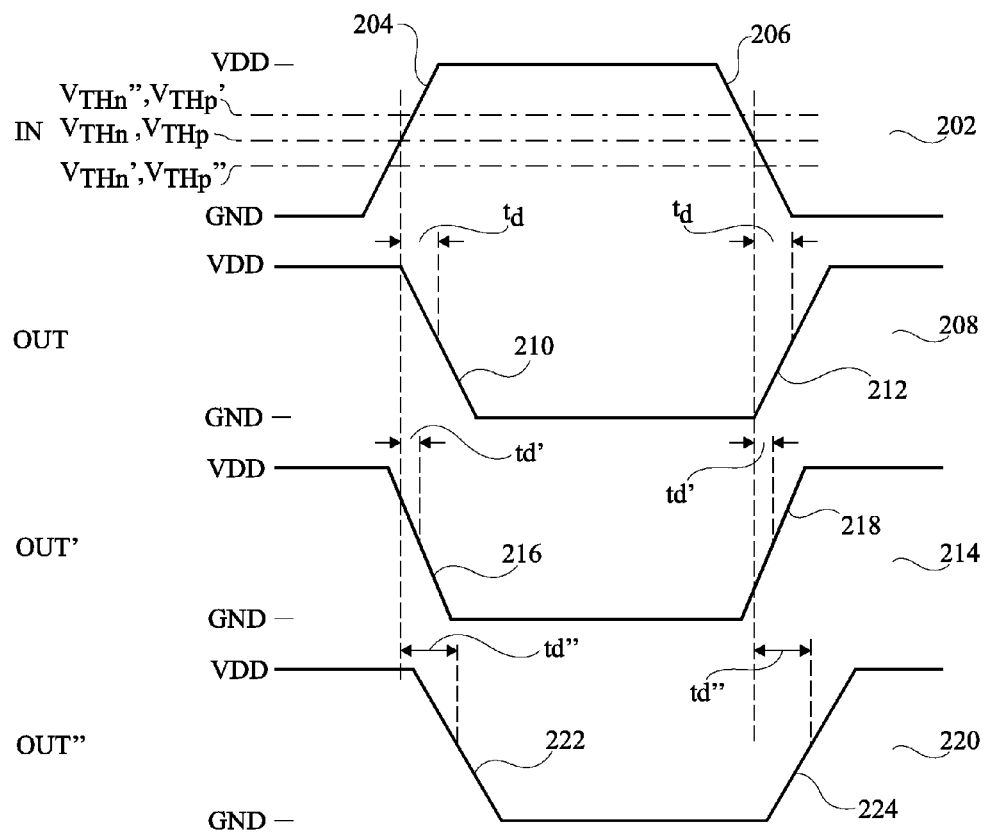
FIG. 2 is a timing diagram illustrating an example of signals in the circuit of FIG. 1.

FIG. 2 is a timing diagram illustrating an example of the input signal IN at node 108, and of the corresponding output signal OUT at node 106, for different levels of the differential control voltages $V_{BG+}$, $V_{BG-}$.

The input signal IN is shown by a first timing diagram 202, and comprises a rising edge 204 and a falling edge 206, extending between low and high levels that are for example at ground and VDD voltages respectively. Each of the edges 204, 206 has a slope, the rise and fall times for example each being of around 10 ps.

An output signal OUT is shown by a second timing diagram 208 in FIG. 2 corresponding to the case in which the control signal $V_{CTRL}$ is for example at a neutral level, for example of around 0.5 V. The control voltages $V_{BG-}$ and $V_{BG+}$ are thus also at neutral levels, for example each equal to substantially half the supply voltage, in other words around VDD/2.

A falling edge 210 of the output signal OUT in diagram 208 is triggered by the rising edge 204 of the input signal IN. The falling edge 210 for example starts to fall when the threshold voltage $V_{THn}$ of transistor 104 is crossed by the input signal IN and the threshold voltage $V_{THp}$ of transistor 102 is crossed by the input signal IN. In the example of FIG. 2, the threshold voltages $V_{THn}$ and $V_{THp}$ are both at the mid-point between the supply voltage VDD and ground, for example each at around 0.5 V. In alternative embodiments the threshold voltages $V_{THn}$ and $V_{THp}$ could be at different levels, which could be different from each other. The slope of the falling edge 210 is, for example, at around the same, but opposite, gradient as that of edge 204, assuming a fan-out of 2 from the output node 106, in other words assuming that the output signal OUT at node 106 drives the gates of two further inverters (not illustrated in FIG. 1). The falling edge 210 is thus delayed by a time $t_d$ with respect to the rising edge 204, measured for example from the mid-point of the rising edge 204 to the mid-point of the falling edge 210.

Similarly, a rising edge 212 of the output signal OUT in diagram 208 is triggered by the falling edge 206 of the input signal IN. The rising edge 212 for example starts to rise when the threshold voltage $V_{THp}$ of transistor 102 is crossed by the input signal IN and the threshold voltage $V_{THn}$ of transistor 104 is crossed by the input signal IN. The slope of the rising edge 212 is for example at around the same, but opposite, gradient as that of edge 206, again assuming a fan-out of 2 from the output node 106. The rising edge 212 is thus also delayed by a time $t_d$ with respect to the falling edge 206, measured for example from the mid-point of the falling edge 206 to the mid-point of the rising edge 212.

A modified output signal OUT' is shown by another diagram 214 corresponding to the case in which the control signal $V_{CTRL}$ is at a relatively high level, for example at around 1 V, and the control voltages $V_{BG+}$ and $V_{BG-}$ are at levels for example of 1 V and 0 V respectively.

A falling edge 216 of the output signal OUT' in diagram 214 is similar to the falling edge 210, except that it has a steeper gradient due to the increased level of the voltage $V_{BG+}$ and decreased level of the voltage $V_{BG-}$. Furthermore, the falling edge 216 starts to fall when the modified threshold voltage $V_{THn}'$ of transistor 104 is crossed by the input signal IN, subsequently aided by the crossing of the modified threshold voltage $V_{THp}'$ of transistor 102 by the input signal IN. The modified threshold voltage $V_{THn}'$ is lower than the threshold voltage $V_{THn}$ due to the increase of voltage level $V_{BG+}$, and is for example at around 0.4 V. The falling edge 216 is thus delayed by a time $t_d'$ with respect to the rising edge 204, time $t_d'$ being shorter than $t_d$.

A rising edge 218 of the output signal OUT' in diagram 214 is similar to the rising edge 212, except that it has also a steeper gradient, due to the increased level of the voltage $V_{BG+}$ and decreased level of the voltage $V_{BG-}$. Furthermore, the rising edge 218 starts to rise when the modified threshold voltage $V_{THp}'$ of transistor 102 is crossed by the input signal IN, subsequently aided by the crossing of the modified threshold voltage $V_{THn}'$ of transistor 104 by the input signal IN. The modified threshold voltage $V_{THp}'$ is higher than the threshold voltage $V_{THp}$ due to the decrease of voltage level $V_{BG-}$, and is for example at around 0.6 V. The rising edge 218 is thus also delayed by a time $t_d'$ with respect to the falling edge 206.

Due to the differential nature of the control voltages $V_{BG-}$ and $V_{BG+}$, the modified time delays $t_d'$ of the falling and rising edges 216, 218 are for example substantially equal to each other.

The modified output signal OUT" is shown by another diagram 220 corresponding to the case in which the control signal $V_{CTRL}$ is at a relatively low level, for example at around 0 V, and the signals $V_{BG+}$ and $V_{BG-}$ are at levels for example of 0 V and 1 V respectively.

A falling edge 222 of the output signal OUT" in diagram 220 is similar to the falling edge 210, except that it has a reduced gradient due to the decreased level of the voltage $V_{BG+}$ and increased level of the voltage $V_{BG-}$. The modified threshold voltage $V_{THp}"$ of transistor 102 is crossed first by the input signal IN, leading to the node 106 becoming high impedance, without changing the voltage level of the output signal OUT". The falling edge 222 starts to fall only when the modified threshold voltage $V_{THn}"$ of transistor 104 is crossed by the input signal IN. The modified threshold voltage $V_{THn}"$ is higher than the threshold voltage $V_{THn}$ due to the decrease of voltage level $V_{BG+}$, and is, for example, at around 0.6 V. The falling edge 222 is thus delayed by a time $t_d"$ with respect to the rising edge 204, time $t_d"$ being longer than $t_d$.

A rising edge 224 of the output signal OUT" in diagram 220 is similar to the rising edge 212, except that it has also a reduced gradient, due to the decreased level of the voltage $V_{BG+}$ and increased level of the voltage $V_{BG-}$. The modified threshold voltage $V_{THn}"$ of transistor 104 is crossed first by the input signal IN, leading to the node 106 becoming high impedance, without significantly changing the voltage level of the output signal OUT". The rising edge 224 starts to rise when the modified threshold voltage $V_{THp}"$ of transistor 102 is crossed by the input signal IN. The modified threshold voltage $V_{THp}"$ is lower than the threshold voltage $V_{THp}$ due to the increase of voltage level $V_{BG-}$, and is for example at around 0.4 V. The rising edge 224 is thus also delayed by a time $t_d"$ with respect to the falling edge 206.

Due to the differential nature of the control voltages $V_{BG-}$ and $V_{BG+}$, the modified time delays $t_d"$ of the falling and rising edges 222, 224 are for example substantially equal to each other.

The present inventors have found that the variation in the differential control voltages $V_{BG+}$, $V_{BG-}$ can achieve a delay variation of around +/−10%. Indeed, in the above example, the delay $t_d$ is for example of around 10 ps, the delay $t_d'$ is for example of around 9 ps, and the delay $t_d"$ is of around 11 ps.

Figure 3:
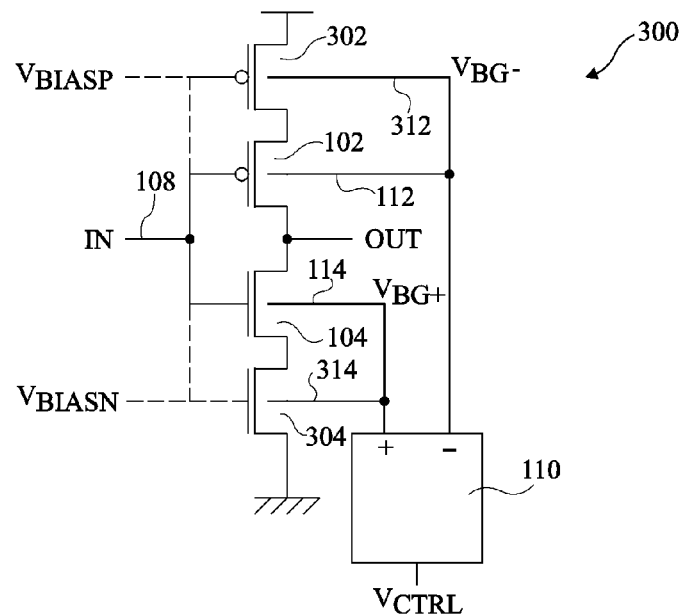
FIG. 3 schematically illustrates a delay circuit according to a further embodiment of the present disclosure.

FIG. 3 illustrates a delay circuit 300 according to a further example. This circuit is similar to circuit 100 of FIG. 1, and like features have been labeled with like reference numerals and will not be described again in detail.

A difference is that the delay circuit 300 additionally comprises a transistor 302, for example a PMOS transistor, coupled by its main current nodes between transistor 102 and the supply voltage, and a transistor 304, for example an NMOS transistor, coupled by its main current nodes between transistor 104 and ground.

Transistor 302 has its control node, for example its gate, coupled to either the input node 108, or to a variable voltage level $V_{BIASP}$, which can be used to control the current through the transistor 102, and thereby provide a further adjustment of the delay of the delay circuit. Transistor 302 also comprises a further control node 312, for example a back gate, which receives the same control voltage $V_{BG-}$ as the further control node 112 of transistor 102.

Similarly, transistor 304 has its control node, for example its gate, coupled to either the input node 108, or to a variable voltage level $V_{BIASN}$, which can be used to control the current through the transistor 104, and thereby provide a further adjustment of the delay of the delay circuit. Transistor 304 also comprises a further control node 314, for example a back gate, which receives the same control voltage $V_{BG+}$ as the further control node 114 of transistor 104.

Figure 4:
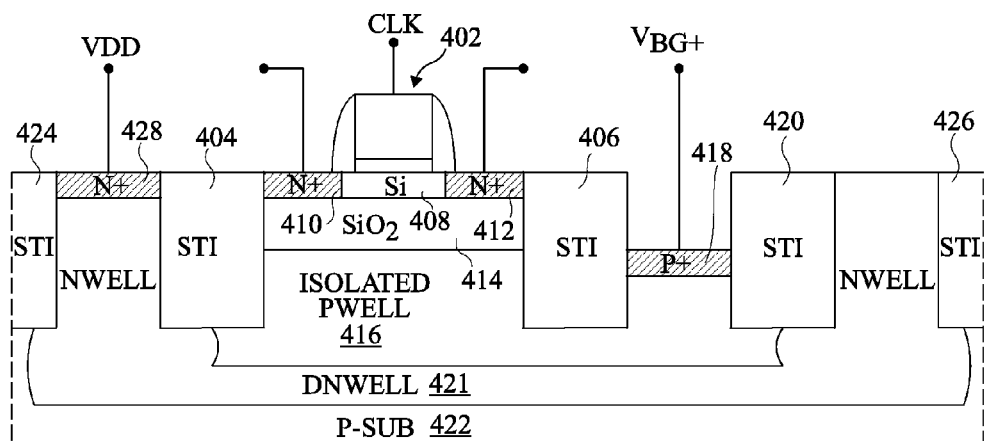
FIG. 4 is a cross-section view of a transistor of the delay circuit of FIG. 1 or 3.

FIG. 4 is a cross-section view of an NMOS transistor that is, for example, used to implement the transistor 104 of FIG. 1 and/or the transistors 104 and 304 of FIG. 3. It will be apparent to those skilled in art how the structure could be adapted to a PMOS implementation for implementing the transistor 102 of FIG. 1 and/or the transistors 102 and 302 of FIG. 3.

In the example of FIG. 4, the transistor has a fully-depleted silicon on insulator (FDSOI) structure. In particular, the transistor comprises a gate stack 402 formed over a thin film of silicon bordered on each side by isolation regions 404, 406, which are for example shallow trench isolations (STI). The silicon film for example has a thickness of between 5 and 10 nm. The silicon film comprises a central silicon region 408 directly under the gate stack 402 and forming a channel region, and heavily doped n-type regions 410 and 412 on each side of the region 408 forming the source and drain of the transistor. A layer of insulator 414 is formed under the silicon film and extends to the isolation regions 404, 406 on each side. Insulator layer 414 is for example a BOX (buried oxide) layer formed of $SiO_2$, and which, for example, has a thickness of between 20 and 30 nm.

A well 416 is, for example, formed under the insulator layer 414, and provides a back gate of the device. A heavily doped region 418 is for example formed between the isolation region 406 and a further isolation region 420, and contacts the well 416. The region 418 forms the further control node, or back gate, of the device that allows the well 416 to be biased by the control voltage $V_{BG+}$.

FIG. 4 illustrates the case in which the well 416 is a PWELL and the contact 418 is a heavily doped P-type region. In such a case, a deep n-type well (DNWELL) 421, for example, extends under the PWELL 416, isolating the PWELL 416 from the p-type substrate 422. The lateral interface between the PWELL 416 and the deep NWELL 421 is, for example, positioned directly under the isolation regions 404 and 420, and the deep NWELL 421 for example extends laterally outwards to further isolation regions 424, 426 on each side. A heavily doped n-type region 428 is for example formed between the isolation trenches 404 and 424, and provides a contact region for the NWELL 421, which is for example coupled to VDD.

It will be apparent to those skilled in the art that in alternative embodiments, the PWELL 416 and P+ region 418 could be replaced by an NWELL and an N+ region in either an NMOS or PMOS implementation, and in such a case the deep NWELL 421 could for example be omitted, the well 416 being formed directly over the p-type substrate 422.

Figure 5:
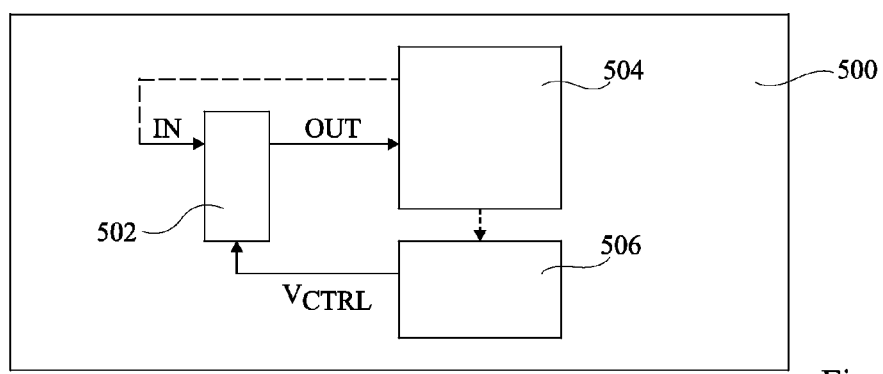
FIG. 5 schematically illustrates a device according to example embodiment of the present disclosure.

FIG. 5 illustrates an example of an electronics device 500 comprising a delay circuit 502, which for example corresponds to the delay circuit 100 of FIG. 1 or to the delay circuit 300 of FIG. 3. The output of the delay circuit 502 is coupled to further circuitry 504, which for example comprises elements forming, with the delay circuit 502, a DLL (delay locked loop), ring oscillator, TDC (time to digital converters), pulse width modulator, or other circuitry that may use a variable delay element. As shown by dashed arrow in FIG. 5, an output of the circuit 504 may be fed back to the input of the delay circuit 502.

The electronic device 500 also, for example, comprises a control block 506 that is configured to generate the control signal $V_{CTRL}$ to the delay circuit 502. In some embodiments, as shown by a dashed arrow between blocks 504 and 506 in FIG. 5, the control block 506 may receive a feedback signal from the circuitry 504, based on which the control signal $V_{CTRL}$ is generated. For example, the feedback signal from the circuitry 504 indicates a timing adjustment, and the control block 506 modifies the control signal $V_{CTRL}$ based on the feedback signal to adjust the time delay of the delay circuit 502.

An advantage of the embodiments described herein is that a delay circuit having a variable delay is provided in a simple fashion. Furthermore, the delay circuit provides a fine control of the time delay over a relatively broad range, for example of up to +/-10% of the normal time delay of an inverter. Furthermore, the delay circuit is adapted to low voltage applications. A further advantage is that no component need be added in the signal path, leading to a relatively low jitter.

Having thus described at least one illustrative embodiment, various alterations, modifications and improvements will readily occur to those skilled in the art.

For example, while in the circuits represented in the various figures, the high and low supply voltages are at VDD and ground, it will be apparent that any suitable voltages could be used, which may depend on the transistor technology.

Furthermore, it will be apparent to those skilled in the art that the transistors represented as p-channel MOS transistors could be replaced in alternative embodiments by n-channel MOS transistors, and vice versa. Furthermore, the various transistors could be implemented in alternative transistor technologies rather than MOS, such as HEMT (high electron mobility transistor) technology.

Furthermore, it will be apparent to those skilled in the art that the various features of the embodiments described herein could be recombined, in alternative embodiments, in any combination.

What is claimed is:

1. A delay circuit comprising:
an input node;
an output node;
a first transistor of a first conductivity type, the first transistor having a control node coupled to the input node, a first main current node coupled to a first supply voltage node, and a second main current node coupled to the output node through a third transistor;
a second transistor of a second conductivity type, the second transistor having a control node coupled to the input node, a first main current node coupled to a second supply voltage node, and a second main current node coupled to the output node through a fourth transistor;
the third transistor having the first conductivity type and having a control node, wherein the first main current node of the first transistor is coupled to the first supply voltage node via the third transistor;
the fourth transistor having the second conductivity type and having a control node, wherein the first main current node of the second transistor is coupled to the second supply voltage node via the fourth transistor; and
a biasing circuit having a first differential control voltage output coupled to a further control node of the first transistor and a second differential control voltage output coupled to a further control node of the second transistor.

2. The delay circuit of claim 1, wherein the biasing circuit is configured to adjust a delay of the delay circuit by modifying voltage levels of the first and second differential control voltages.

3. The delay circuit of claim 1, wherein the biasing circuit comprises a differential amplifier.

4. The delay circuit of claim 1, further comprising a control circuit coupled to a control input of the biasing circuit to provide a control signal to the biasing circuit to control levels of the first and second differential control voltages based on a delay to be applied by the delay circuit.

5. The delay circuit of claim 1, wherein the first and second transistors each comprise an SOI (semiconductor on insulator) structure and wherein the further control nodes are coupled to back gates of the first and second transistors.

6. The delay circuit of claim 5, wherein the first and second transistors each comprise a semiconductor layer isolated from the back gate of the respective transistor by a layer of insulator.

7. The delay circuit of claim 5, wherein the first transistor comprises a p-type well forming the back gate and wherein the p-type well is isolated from a p-type substrate by a deep n-type well.

8. The delay circuit of claim 1, wherein the first differential control voltage output of the biasing circuit is coupled to a further control node of the third transistor and wherein the second differential control voltage output of the biasing circuit is coupled to a further control node of the fourth transistor.

9. The delay circuit of claim 1, wherein the control node of the third transistor is coupled to the input node and wherein the control node of the fourth transistor is coupled to the input node.

10. The delay circuit of claim 1, wherein the control node of the third transistor is coupled to receive a third control voltage and the control node of the fourth transistor is coupled to receive a fourth control voltage.

11. An electronic device comprising:
the delay circuit of claim 1; and
circuitry coupled to the output node of the delay circuit.

12. The electronic device of claim 11, wherein the circuitry provides a feedback signal to the biasing circuit.

13. A delay circuit comprising:
an input node;
an output node;
a p-type silicon on insulator (SOI) transistor having a gate coupled to the input node, a first source/drain region coupled to a first supply voltage node, and a second source/drain region coupled to the output node;
an n-type SOI transistor having a gate coupled to the input node, a first source/drain region coupled to a second supply voltage node, and a second source/drain region coupled to the output node; and
a biasing circuit having a first delay control output coupled to a back gate of the p-type SOI transistor and a second delay control output coupled to a back gate of the n-type SOI transistor;
wherein the first source/drain region and the second source/drain region of the n-type SOI transistor are separated by a channel region;

wherein the first source/drain region, the second source/drain region, and the channel region of the n-type SOI transistor are disposed on an oxide layer;
wherein the oxide layer is disposed on a p-type well that forms the back gate of the n-type SOI transistor;
wherein the p-type well is disposed in an n-type well; and
wherein the n-type well is disposed in a substrate.

14. The delay circuit of claim 13, wherein the biasing circuit comprises a differential amplifier.

15. The delay circuit of claim 13, further comprising a control circuit coupled to a control input of the biasing circuit to provide a control signal to the biasing circuit to control levels of signals provided at the first and second delay control outputs.

16. The delay circuit of claim 13, further comprising:
a second p-type transistor having a control node, wherein the first source/drain region of the second p-type transistor is coupled to the first supply voltage node via the second p-type transistor; and
a second n-type transistor a control node, wherein the first source/drain region of the second n-type transistor is coupled to the second supply voltage node via the second n-type transistor.

17. The delay circuit of claim 16, wherein the second p-type transistor comprises an SOI transistor;
wherein the first delay control output of the biasing circuit is coupled to a back gate of the second p-type transistor;
wherein the second n-type transistor comprises an SOI transistor; and
wherein the second delay control output of the biasing circuit is coupled to a back gate of the second n-type transistor.

18. The delay circuit of claim 16, wherein the control node of the second p-type transistor is coupled to the input node and the control node of the second n-type transistor is coupled to the input node.

19. The delay circuit of claim 16, wherein the control node of the second p-type transistor is coupled to receive a third control voltage and the control node of the second n-type transistor is coupled to receive a fourth control voltage.

20. A method of operating a delay circuit, the method comprising:
generating first and second differential control voltages;
applying the first differential control voltage to a further control node of a first transistor and further control node of a third transistor having a first conductivity type, the first transistor and the third transistor having control nodes coupled to an input node of the delay circuit, a first main current node of the first transistor coupled to a first supply voltage, and a second main current node of the first transistor coupled to an output node of the delay circuit through the third transistor;
applying the second differential control voltage to a further control node of a second transistor and a further control node of a fourth transistor having a second conductivity type, the second transistor and the fourth transistor having control nodes coupled to the input node, a first main current node of the second transistor coupled to a second supply voltage, and a second main current node of the second transistor coupled to the output node through the fourth transistor; and
applying an input signal to the input node, wherein an output signal carried at the output node is based upon the input signal and has a delay time based on the first and second differential control voltages.

21. The method of claim 20, further comprising modifying voltage levels of the first and second differential control voltages based on a delay adjustment to be applied by the delay circuit.

22. The method of claim 20, further comprising receiving a control signal, wherein values of the first and second differential control voltages are based upon the control signal.

23. The method of claim 20, wherein the first, second, third and fourth transistors comprise silicon on insulator (SOI) transistors;
wherein applying the first differential control voltage to the further control node of the first transistor comprises applying the first differential control voltage to a back gate of the first transistor;
wherein applying the second differential control voltage to the further control node of the second transistor comprises applying the second differential control voltage to the back gate of the second transistor;
wherein applying the first differential control voltage to the further control node of the third transistor comprises applying the first differential control voltage to a back gate of the third transistor; and
wherein applying the second differential control voltage to the further control node of the fourth transistor comprises applying the second differential control voltage to a back gate of the fourth transistor.

24. A method of operating a delay circuit, the method comprising:
generating first and second differential control voltages;
applying the first differential control voltage to a back gate of an n-type SOI transistor, the n-type SOI transistor having a gate coupled to an input node of the delay circuit, a first source/drain region coupled to a first supply voltage, and a second source/drain region coupled to an output node of the delay circuit;
applying the second differential control voltage to a back gate of a p-type SOT transistor, the p-type SOI transistor having a gate coupled to the input node, a first source/drain region coupled to a second supply voltage, and a second source/drain region coupled to the output node; and
applying an input signal to the input node, wherein an output signal carried at the output node is based upon the input signal and has a delay time based on the first and second differential control voltages;
wherein the first source/drain region and the second source/drain region of the n-type SOI transistor are separated by a channel region;
wherein the first source/drain region, the second source/drain region, and the channel region of the n-type SOI transistor are disposed on an oxide layer;
wherein the oxide layer is disposed on a p-type well that forms the back gate of the n-type SOI transistor;
wherein the p-type well is disposed in an n-type well; and
wherein the n-type well is disposed in a substrate.

25. The method of claim 24, further comprising modifying voltage levels of the first and second differential control voltages based on a delay adjustment to be applied by the delay circuit.

26. The method of claim 24, further comprising receiving a control signal, wherein values of the first and second differential control voltages are based upon the control signal.

* * * * *